United States Patent
Na et al.

(10) Patent No.: US 9,099,581 B2
(45) Date of Patent: Aug. 4, 2015

(54) RE-ENTRANT MIRROR PHOTODETECTOR WITH WAVEGUIDE MODE FOCUSING

(75) Inventors: Yun-Chung Neil Na, Palo Alto, CA (US); Yuval Saado, Qiriyat Gat (IL); Yimin Kang, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/996,528

(22) PCT Filed: Dec. 28, 2011

(86) PCT No.: PCT/US2011/067521
§ 371 (c)(1),
(2), (4) Date: Jun. 20, 2013

(87) PCT Pub. No.: WO2013/100950
PCT Pub. Date: Jul. 4, 2013

(65) Prior Publication Data
US 2014/0217537 A1  Aug. 7, 2014

(51) Int. Cl.
*H01L 31/0232* (2014.01)
*H05K 1/02* (2006.01)
*G02B 6/43* (2006.01)
*G01J 1/02* (2006.01)
*G01J 1/04* (2006.01)
*G02B 6/42* (2006.01)

(52) U.S. Cl.
CPC ......... *H01L 31/02327* (2013.01); *G01J 1/0204* (2013.01); *G01J 1/0411* (2013.01); *G01J 1/0414* (2013.01); *G02B 6/4204* (2013.01); *G02B 6/4214* (2013.01); *G02B 6/43* (2013.01); *H05K 1/0274* (2013.01)

(58) Field of Classification Search
CPC ...... G02B 6/4214; G02B 6/43; H05K 1/0274; H01L 31/02327
USPC .............. 257/432, E31.127; 385/132; 438/65
See application file for complete search history.

(56) References Cited

U.S. PATENT DOCUMENTS

| 5,418,765 A | * | 5/1995 | Misawa et al. ............. 369/44.12 |
| 7,316,512 B2 | * | 1/2008 | Shih et al. ........................ 385/93 |
| 2003/0034431 A1 | | 2/2003 | Mandella et al. |
| 2006/0023990 A1 | | 2/2006 | Shih et al. |
| 2009/0080830 A1 | | 3/2009 | Matsuoka et al. |
| 2011/0026878 A1 | | 2/2011 | Matsuoka et al. |

OTHER PUBLICATIONS

International Search Report and Written Opinion from PCT/US2011/067521 mailed Aug. 30, 2012, 9 pages.
"PCT, International Preliminary Report on Patentability (Chapter I of the Patent Cooperation Treaty) for International Application No. PCT/US2011/067521", (Jul. 10, 2014), Whole Document.
"Office Action for Taiwan Patent Application No. 101147875", (Dec. 11, 2014), Whole Document.

* cited by examiner

*Primary Examiner* — Howard Weiss
(74) *Attorney, Agent, or Firm* — Blakely, Sokoloff, Taylor & Zafman LLP

(57) ABSTRACT

A photonic integrated circuit (I/C) includes a focusing sidewall or in-plane surface that redirects and focuses light from a waveguide to a photodetector structure. The focusing includes redirecting an optical signal to a width smaller than a width of the waveguide. The focusing of the light allows the photodetector structure to be outside a waveguide defined by parallel oxide structures. With the photodetector structure outside the waveguide, the contacts can be placed closer together, which reduces contact resistance.

25 Claims, 6 Drawing Sheets

RE-ENTRANT MIRROR PHOTODETECTOR WITH WAVEGUIDE MODE FOCUSING

STATEMENT OF GOVERNMENT LICENSE RIGHTS

This invention was made with Government support under contract number H98230-10-9-0021 awarded by the Department of Defense. The Government has certain rights in this invention.

This application is a U.S. National Phase application under 35 U.S.C. §371 of International Application No. PCT/US11/67521 filed Dec. 28, 2011, and claims the benefit of priority to that International Application.

FIELD

Embodiments of the invention are generally related to optical circuits, and more particularly to a photodetector circuit with a focusing mirror.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2011, Intel Corporation, All Rights Reserved.

BACKGROUND

Photonic circuits find increasing use in computing devices. The use of optical signals in device communication has significant potential advantages over electrical communication, namely in terms of power and bandwidth. However, many practical implementations of optical communication are still lacking One of the primary difficulties facing the use of optical signals has to do with scaling of the optical configuration, especially in converting between optical to electrical signals.

FIG. 1 is a block diagram of a prior art system with a photodetector disposed over a waveguide channel. Device 100 is shown from a top view, looking from above a semiconductor structure. Device 100 includes a large SOI (silicon on insulator) waveguide photodetector 120. The cross section area of photodetector 120 is in the range of 10 µm² to 30 µm² and has a mechanism that allows source light 102 to be vertically reflected onto photodetector 120. Source light 102 propagates through a channel formed by oxide 132 and oxide 134, until vertically reflected to a Ge diode on top of the reflected light spot to be absorbed and converted to an electrical signal.

While the structure of device 100 provides responsivity and bandwidth higher than traditional devices (>0.8 A/W for responsivity and >18 GHz for bandwidth), further performance scaling is limited. Photodetector 120 operates to provide an electrical signal based on contacts 112 and 114. The distance between the two contact vias is relatively long—no shorter than 20/sin(2×54.7)/2=10.6 µm for 20 µm thick SOI. Such a long length creates a large resistance in the conduction path from photodetector 120 to an associated contact 114 that connects to the Si of the waveguide. The bandwidth of device 100 is therefore strongly constrained by the RC (resistive-capacitive) characteristics of the device.

The RC characteristic can be reduced by reducing the size of photodetector 120, but that is expected to rapidly decrease the responsivity of device 100 due to a fixed design rule in-between the photodetector and the oxide trenches 132 and 134. Attempting to place contact 114 closer to contact 112 by lateral placement instead of longitudinal placement is ineffective due to the oxide filled trench. A conduction path between the contacts cannot be created without major modifications to device 100. For example, fabrication processes would be greatly complicated by use of a poly shunt and a segmented waveguide. The poly shunt would be in place of part of the oxide in the trench, replaced with amorphous Si, for example. Such an approach inevitably introduces topology and may raise various processing issues afterwards. Also, the resistance of a poly shunt can be large without appropriate design/process fine tune. The segmented waveguide would result in the waveguide not being fully confined by the oxide, which is expected to reduce responsivity.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

DETAILED DESCRIPTION

As described herein, a photonic integrated circuit (I/C) includes, in plane, a focusing mirror sidewall, with arbitrary shape, that redirects and focuses light from a waveguide to a photodetector structure. The focusing mirror can be referred to as a sidewall, indicating that the mirror is in the same plane as the light, and focuses and redirects the light in-plane. The focusing mirror could alternatively be referred to as a surface, but it would be understood that it is not a top surface of the circuit. The focusing includes redirecting an optical signal to a width smaller than a width of the waveguide. The focusing of the light allows the photodetector structure to be outside a waveguide defined by parallel oxide structures. With the photodetector structure outside the waveguide, the contacts can be placed closer together, which reduces the resistance from the photodetector structure to contacts that are associated with the photodetector structure.

Figure 2:
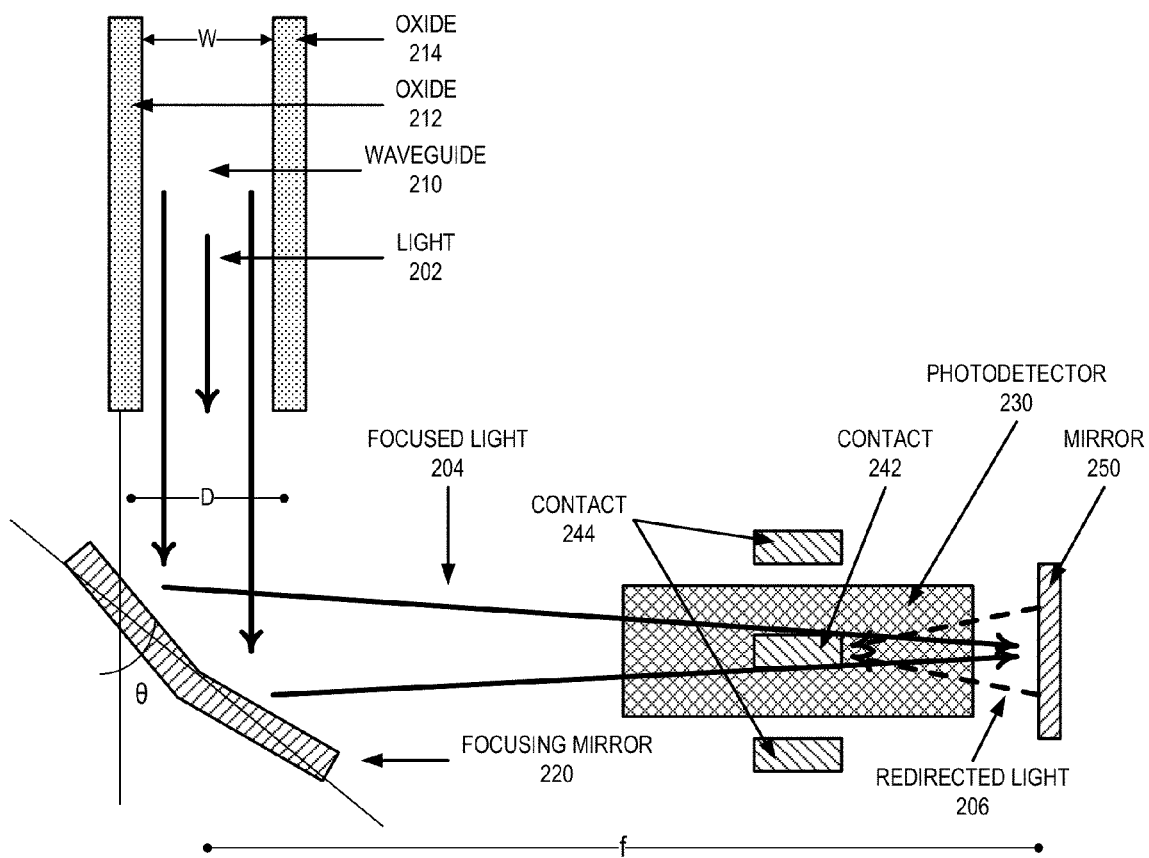
FIG. 2 is a block diagram of an embodiment of a circuit with a focusing mirror and a photodetector not over a waveguide channel.

FIG. 2 is a block diagram of an embodiment of a circuit with a focusing mirror and a photodetector not over a waveguide channel. Circuit 200 is a photonic circuit that can be included in a semiconductor integrated circuit (I/C). It will be understood that an I/C can refer to any circuit, such as circuit 200, that provides a specific functionality, and/or to a larger group of elements to which a circuit of a specific functionality belongs. Thus, an I/C can refer to an entire chip, or to circuit elements of the chip. Thus, circuit 200 can be part of a larger circuit, or other circuits can be added to a common semiconductor backplane on which circuit 200 is processed. Circuit 200 is manufactured or processed into or onto the semiconductor of an I/C.

Circuit 200 is to receive source light 202 propagating along waveguide 210, focus it (focused light 204) with focusing mirror 220, and redirect it (redirected light 206) with mirror 250 to photodetector 230. Circuit 200 can be used in any of a number of devices. Common uses of photodetectors include applications in optical communications, laser range finders, and low-light systems. The high bandwidth and responsivity of circuit 200 make it a good candidate for use in optical communication systems.

Source light 202 can be any light that is received to be detected. The coupling of a light source to a semiconductor is assumed to be performed in accordance with the understanding of those skilled in the art and will not be discussed herein. The received light 202 propagates along waveguide 210, which is a waveguide constrained or defined by oxide 212 and oxide 214. Oxide 212 and 214 are parallel oxide structures manufactured into a semiconductor material. The oxide horizontally constrains the waveguide mode. In one embodiment, the waveguide mode is constrained vertically by a layer of oxide below (e.g., an SOI (silicon on insulator) structure) and an oxide layer (e.g., cladding) or air above.

Waveguide 210 has a width W, which is defined by the parallel oxide structures. The width W is useful in determining properties of focusing mirror 220, as well as placement of photodetector 230. Focusing mirror 220 redirects light from waveguide 210 to photodetector 230. Focusing mirror 220 has an aperture of width D, which is typically slightly larger than W, to account for the spread of light that occurs as light 202 exits waveguide 210 toward focusing mirror 220.

In one embodiment, as shown, focusing mirror 220 is a sidewall positioned at an angle with respect to waveguide 210. Alternatively, focusing mirror 220 could be considered an angled sidewall. The angle of the sidewall and aperture of focusing mirror 220 is shown as θ, which is an angle that provides total internal reflection (TIR). It is understood that TIR can be dependent on the angle of incidence, and the refractive index of the materials used. Any surface that causes total internal reflection can be referred to as a TIR surface. In the case of the focusing mirror, it could be referred to as a TIR sidewall. Focusing mirror 220 includes multiple facets that provide the redirection and convergence of light. The focusing of light is generally more precise with a larger number of facets, but can be achieved with a number of facets more than one.

Focusing mirror 220 is of a material that causes the TIR to occur. In one embodiment, focusing mirror 220 is simply an oxide barrier processed by etching a channel and filling it with oxide. In one embodiment, focusing mirror 220 is some other material of different refractive index that redirects the light with TIR, and provides focusing of the light. In one embodiment, focusing mirror 220 is a thin layer of metal deposited on an exposed surface and utilizes metallic reflection rather than TIR.

In one embodiment, photodetector 230 is at a right angle, or substantially at a right angle with respect to waveguide 210. Light 202 is thus redirected at some angle, which may be 90 degrees. Focused light 204 is light 202 reflected in a way that the individual photons that make up the light converge. Focused light 204 has a smaller width, and more intensity than light 202. Light 202 has a width approximately equal to W—as a practical matter, the optical mode is typically a little wider than the waveguide.

The theoretical focus point of light is a point, but it is understood that perfect convergence to a point does not occur due to physical effects. The theoretical "point" is a point at which the focal line from the top of the aperture crosses the focal line from the bottom of the aperture. Length f from focusing mirror 220 to mirror 250 can be adjusted to be at or before (or after) the crossover point or the focal point. In one embodiment, f is shorter than a distance to the focal point.

Mirror 250 vertically redirects focused light 204 toward photodetector 230. Redirected light 206 is reflected light of focused light 204, vertically redirected toward photodetector 230. In one embodiment, redirected light 206 is positioned to redirect the light to a center of photodetector 230 directly under a center contact 242. As shown, photodetector 230 is outside waveguide 210. Photodetector 230 is outside the waveguide because it is horizontally not over the waveguide mode as defined by oxide 212 and oxide 214.

Figure 1:
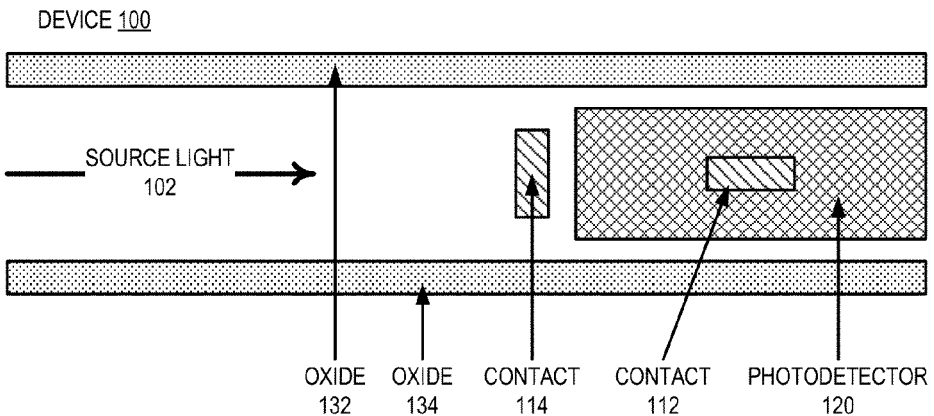
FIG. 1 is a block diagram of a prior art system with a photodetector disposed over a waveguide channel.

In one embodiment, photodetector 230 has a length and a width, with the length greater than the width. Thus, photodetector 230 can have lateral and longitudinal sides. As seen in FIG. 1, when the photodetector is over the waveguide mode, there are processing practicalities that make it impracticable to place the semiconductor contact to a lateral side of the photodetector. Photodetector 230 is not over waveguide 210. Thus, contact 244 is positioned to a lateral side of photodetector 230. Bottom contact 244 is coplanar to the bottom of photodetector 230 so that it can reach from the surface of the I/C to the semiconductor on which photodetector 230 is processed.

Light directed to photodetector 230 produces an electrical signal that is able to be read and processed digitally by processing logic (not shown). Photodetector 230 can be a photodetector stack, referring to a manufacture of different layers of material that provide the light sensitive operation of the photodetector. In one embodiment, photodetector 230 is an avalanche photodetector. Avalanche photodetectors are used in applications where greater amplification of a received light signal is desired, such as detecting a weak signal.

Figure 3A:
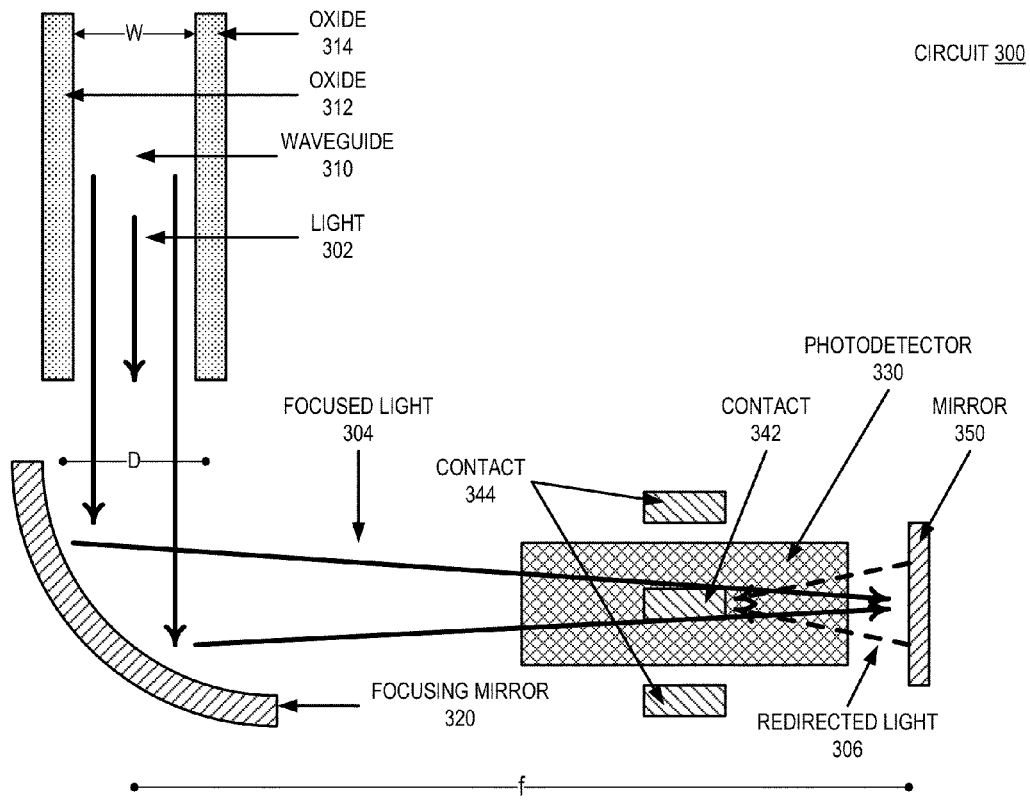
FIG. 3A is a block diagram of top view of an embodiment of a circuit with a parabolic focusing mirror and a photodetector not over a waveguide channel.

FIG. 3A is a block diagram of top view of an embodiment of a circuit with a parabolic focusing mirror and a photodetector not over a waveguide channel. Circuit 300 is a photonic circuit, and can be one example of circuit 200 of FIG. 2. The difference between circuit 300 and circuit 200 is that focusing mirror 320 is a parabolic mirror, which could be considered an example of focusing mirror 220 with an infinite number of facets.

Thus, the descriptions above with respect to circuit 200 of FIG. 2 apply equally well with respect to circuit 300. Namely, descriptions of waveguide 210, oxide 212, oxide 214, source light 202, focused light 204, redirected light 206, photodetector 230, mirror 250, and contacts 242 and 244 apply equally well to corresponding waveguide 310, oxide 312, oxide 314, source light 302, focused light 304, redirected light 306, photodetector 330, mirror 350, and contacts 342 and 344. Rather than repeating those descriptions, reference is hereby made to FIG. 2 above.

As mentioned above, in one embodiment, the focusing mirror is an uninterrupted curve or a sidewall with an infinite number of facets. In one embodiment, focal length can be made shorter with focusing mirror 320 than with focusing mirror 220, due to more precise convergence of focused light 304 from the curved sidewall of focusing mirror 320.

Similarly to focusing mirror 220, focusing mirror 320 is of a material that causes the TIR to occur. In one embodiment, focusing mirror 320 is simply an oxide barrier processed by etching a channel and filling it with oxide. In one embodiment, focusing mirror 320 is a thin layer of metal deposited in an exposed surface. In one embodiment, focusing mirror 320 is some other material of different refractive index that redirects the light with total internal reflection, and provides focusing of the light.

Figure 3B:
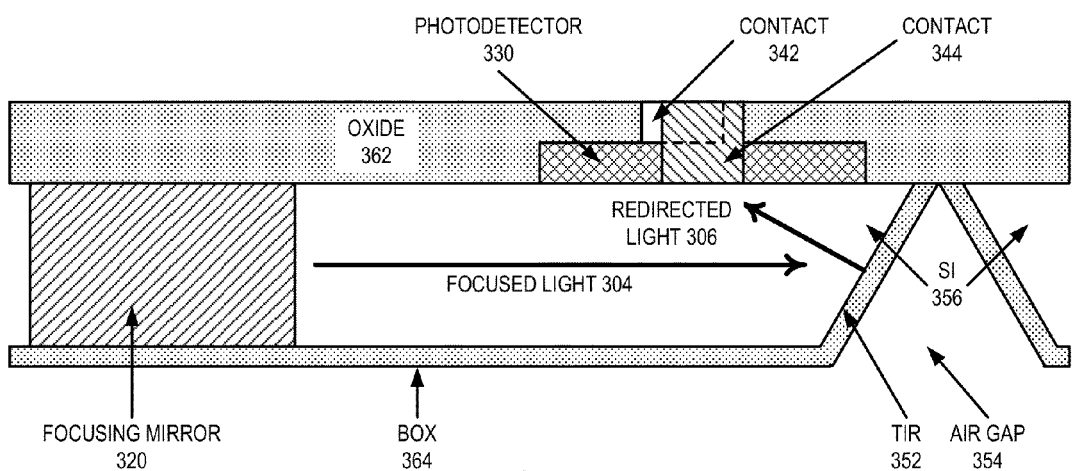
FIG. 3B is a block diagram of cross section of an embodiment of the circuit of FIG. 3A with a parabolic focusing mirror and a photodetector not over a waveguide channel.

FIG. 3B is a block diagram of cross section of an embodiment of the circuit of FIG. 3A with a parabolic focusing mirror and a photodetector not over a waveguide channel. It will be understood that the cross section of circuit 200 would be similar or identical to that shown in FIG. 3B.

In the cross section of circuit 300 in FIG. 3B, circuit 300 is seen from the perspective of FIG. 3A being rotated back into the page with respect to focusing mirror 320. Thus, focusing mirror 320 is the "front-most" element of FIG. 3B. Oxide barriers 312 and 314, which define waveguide 310 as seen in FIG. 3A, would be behind focusing mirror 320 into the page.

In one embodiment, circuit 300 is formed with a semiconductor on insulator, where the semiconductor is typically silicon. The SOI substrate includes BOX (bulk oxide) 364 as a layer beneath the semiconductor in which circuit 300 is processed, and which provides the material of waveguide 310. In one embodiment, the semiconductor material is silicon 356. The circuit is also bound on the upper portion by oxide 362. Focused light 304 propagates through silicon 356 to TIR surface 352, which redirects it as redirected light 306 to photodetector 330.

In one embodiment, TIR 352 is a re-entrant mirror (REM) that vertically redirects focused light 304 to photodetector 330. TIR 352 is coplanar with waveguide 310, and is angled to provide a TIR of the light vertically toward the photodetector. In one embodiment, TIR 352 is formed by depositing oxide after air gap 354 is created. In another embodiment, a different material could be used. In one embodiment, TIR has air gap 354 behind it, "behind" in reference to a direction of propagation of focused light 304. Alternatively, air gap 354 could be another material that affects a refractive index of the TIR surface (TIR 352).

Contacts 342 and 344 are also illustrated in FIG. 3B. For purposes of clarity in the drawing, the blocks representing contacts 342 and 344 are offset from each other to show their relative positioning. They are not necessarily offset in a practical implementation. In one embodiment, they are horizontally aligned with respect to each other in a cross section view. However, they are also shown offset to indicate that contact 342 that is vertically above and over photodetector 330 traverses from the top of oxide 362 to the top of photodetector 330. Contact 344 traverses from the top of oxide 362 to the top of silicon 356, providing a conduction path for the electrical signals produced in the contacts by photodetector 330. The conduction path between contacts 342 and 344 is not blocked by oxide, and does not require special semiconductor processing to create. Additionally, the contacts are parallel along the lateral side of photodetector. Thus, the contacts are separated by a little more than half the width of photodetector 330, instead of more than half the length as in device 100.

Figure 4:
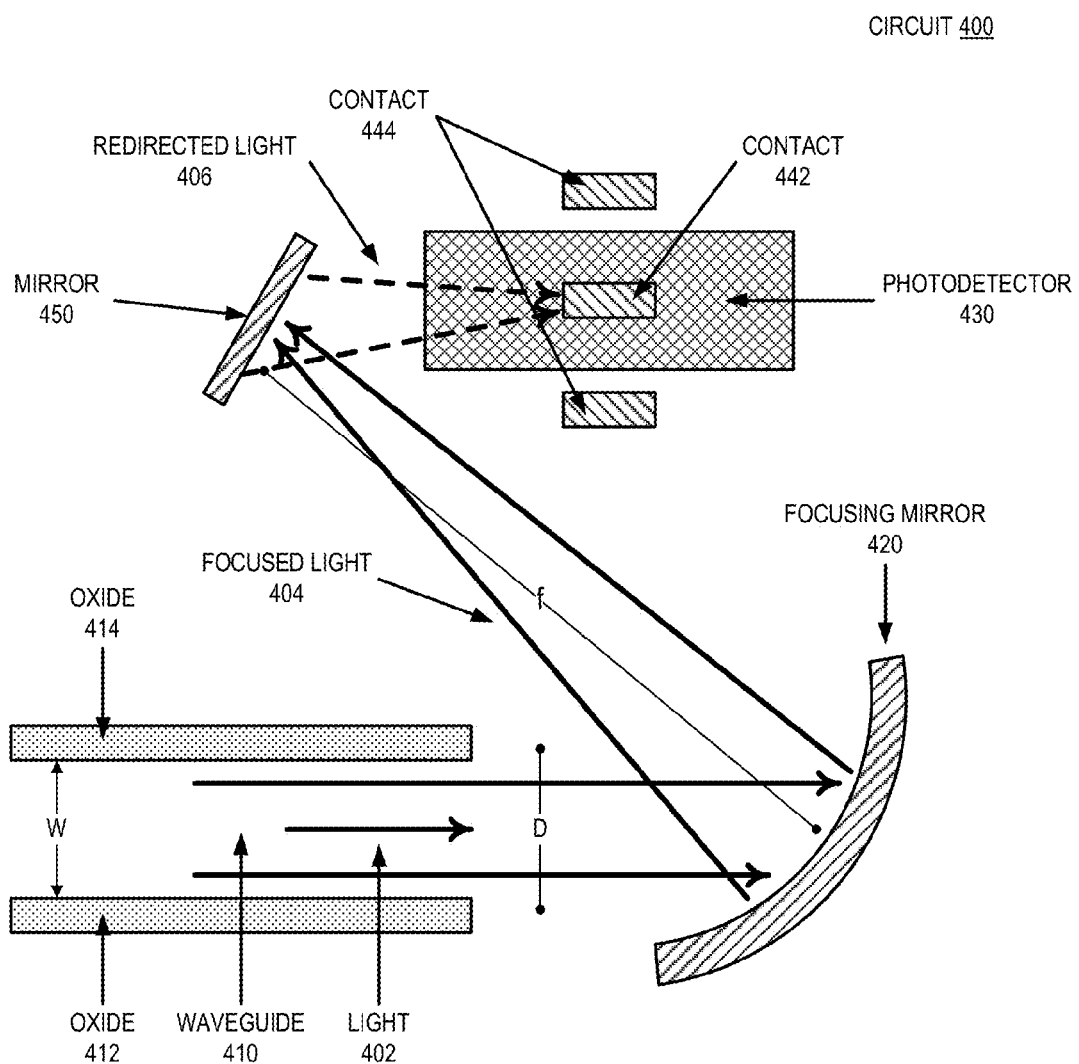
FIG. 4 is a block diagram of an embodiment of a circuit with a focusing mirror and a photodetector not over a waveguide channel, where the optical redirection is not at a right angle.

FIG. 4 is a block diagram of an embodiment of a circuit with a focusing mirror and a photodetector not over a waveguide channel, where the optical redirection is not at a right angle. As seen in circuit 400, the focusing from the focusing mirror does not need to redirect the focused light at a right angle, but can be any arbitrary angle. In one embodiment, as shown in circuit 400, the redirecting mirror can redirect light both vertically, and horizontally, as opposed to just vertically as shown in circuits 200 and 300 above. It will be understood that the cross section of circuit 400 would be more complicated than what is shown in FIG. 3B. The fabrication process may also be somewhat more complicated to produce mirrors at arbitrary angles.

It will be understood that the concavity of the focusing mirror will be greater or lesser depending on the desired angle of redirection and focus. For angles of redirection of less than 90 degrees, the concavity of the focusing mirror will be less (as illustrated in circuit 400). For angles of redirection of greater than 90 degrees, the concavity of the focusing mirror will be greater. It will be understood that the principle of concavity will apply whether using an infinite number of facets as with the illustrated curved focusing mirror, or with a finite number of facets. Thus, focusing mirrors of different concavity can be used to achieve redirection and focusing of light at different angles.

The descriptions above with respect to similar elements of circuits 200 and 300 apply equally well with respect to circuit 400. Namely, descriptions of waveguide 210, oxide 212, oxide 214, source light 202, focused light 204, redirected light 206, photodetector 230, mirror 250, and contacts 242 and 244 apply equally well to corresponding waveguide 410, oxide 412, oxide 414, source light 402, focused light 404, redirected light 406, photodetector 430, mirror 450, and contacts 442 and 444, with the exception of the differences in angle of mirror 450. Rather than repeating those descriptions, reference is hereby made to FIG. 2 above.

As mentioned above, in one embodiment, the focusing mirror is an uninterrupted curve or a surface with an infinite number of facets. In one embodiment of circuits 200 and 300, the optical focal point of the focusing mirror is approximately at a right angle from the source light (i.e., the focusing mirror focuses light to a point at an angle approximately 90 degrees from the line of propagation of the source light). As seen in circuit 400, the focal point of focusing mirror 420 is at mirror 450, which is at an arbitrary angle from the line of propagation of light 402.

Furthermore, mirror 450 redirects focused light 404 vertically to photodetector 430, but also redirects the focused light at an angle with respect to the line of propagation from focusing mirror 420 to the focal point at mirror 450. As seen in circuits 200 and 300, their redirected light was along the same line of propagation as the focused light, but vertically, and in the opposite direction. In circuit 400, redirected light 406 is vertically redirected, and also horizontally redirected.

Similarly to focusing mirror 220, focusing mirror 420 is of a material that causes the TIR to occur. In one embodiment, focusing mirror 420 is simply an oxide barrier processed by etching a channel and filling it with oxide. In one embodiment, focusing mirror 420 is some other material of different refractive index that redirects the light with TIR, and provides focusing of the light. In one embodiment, focusing mirror 420 is a thin layer of metal deposited in an exposed surface. In one embodiment, mirror 450 can also be of a material that causes TIR, and could be an oxide barrier. In one embodiment, mirror 450 can also be a thin layer of metal deposited in an exposed surface.

While reference is made above to the drawings, a more general discussion without specific reference to the figures follows. The focusing mirror is discussed above with respect to an SOI waveguide structure. It will be understood that a focusing mirror could be used in other semiconductor environments as well. In one embodiment, the photodetector includes a germanium diode structure on top of the light spot reflected from a REM sidewall.

The structure described herein works equally well with a p-i-n diode and a p-i-p-i-n diode (e.g., an SACM (separate absorption charge multiplication) avalanche photodetector). The design rules between absorption layer, charge layer, and multiplication layer could make the effective photodetector area covering the REM reflection spot smaller, which would degrade the primary responsivity in traditional systems. However, focusing the light prior to the vertical reflection still allows for good transfer of energy to the smaller spot.

In one embodiment, as discussed above, the focusing mirror can be formed by etching a curved trench and subsequently filling it with oxide, which can be fabricated at the same processing phase as waveguide formation, where the mirror reflection is made possible by a total-internal reflection. Alternatively, a thin metallic coating on the trench sidewall can provide similar function. The focusing mirror allows the photodetector to be fabricated on top of a REM or other vertical mirror that is spatially away from the waveguide.

The focused spot size of focused light is proportional to f/D, where f is the focal length of the mirror and D is the input aperture of the mirror. In one embodiment, the focusing mirror is located close to the waveguide in a way that D is approximately the same as W, the width of the waveguide. If the focusing mirror is placed further from the focusing mirror, the light will spread as it exits the waveguide, requiring a larger aperture to redirect all the light to achieve good energy transfer. In one embodiment, W is larger than 10 µm.

Study was also made as to the location of a REM opening with respect to the focused spot. For a REM of approximately 45°, the location of the REM opening would be right above the focused spot. For a REM of 54.7°, the calculated location of the REM opening would be 3.5 to 4 µm to the front of the focused spot.

Figure 5:
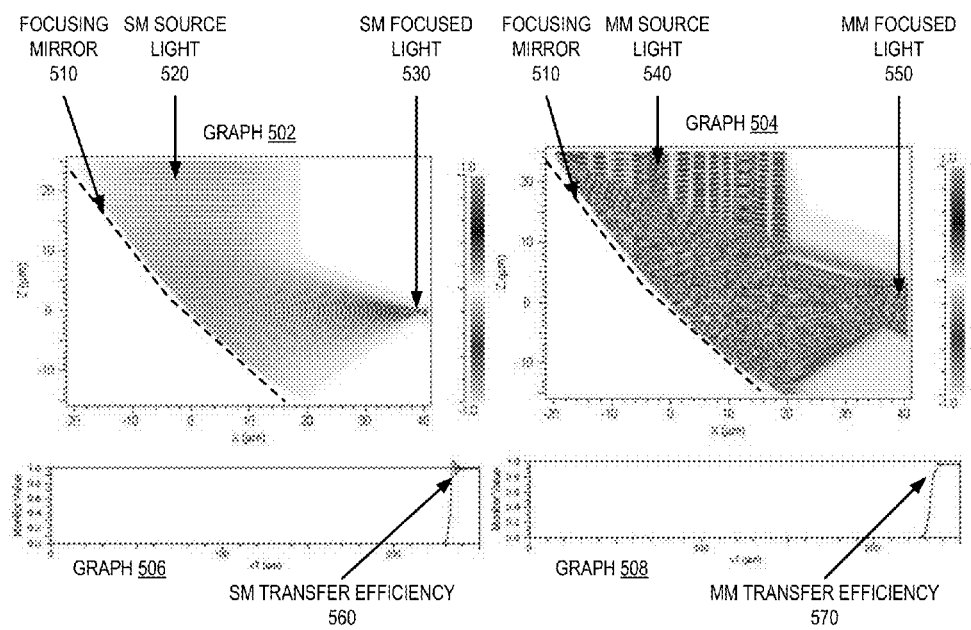
FIG. 5 is a graphical representation of an embodiment of energy transfer efficiency for a circuit with a photodetector having a focusing mirror.

FIG. 5 is a graphical representation of an embodiment of energy transfer efficiency for a circuit with a photodetector having a focusing mirror. Graph 502 illustrates a simulation result using a parabolic focusing mirror with single-mode (SM) excitation. Graph 504 illustrates a similar simulation result using a parabolic focusing mirror with multi-mode (MM) excitation. Single-mode source light 520 is reflected and focused by focusing mirror 510 to single-mode focused light 530. The initial width or spot size of SM source light 520 is approximately 40 µm, while the focused spot size is just a few µm. Multi-mode source light 540 is also approximately 40 µm initially, and is focused to less than 10 µm at multimode focused light 550.

In both cases, the initial 40 µm spot size can be focused well below 10 µm, and therefore permits the fabrication of a 10 µm wide photodetector or avalanche photodetector (PD/APD) on top of a vertical mirror. It is significant to note that the same focusing mirror 510 can be used with either single-mode or multi-mode optical signals. Thus, it is possible to construct a PD/APD structure with a focusing mirror that can be used in either single-mode or multi-mode applications. In the simulations, the waveguide width, W=40 µm, and the focal length, f=20 µm.

In another simulation, a 10 µm monitor was placed at the focal point to measure energy transfer efficiency. As shown in graph 506, the SM transfer efficiency 560 is 1.0 at the monitor. As shown in graph 508, the MM transfer efficiency 570 is well above 90%, and is therefore close to 1. Thus, good performance is achieved for both SM and MM source light.

Figure 6:
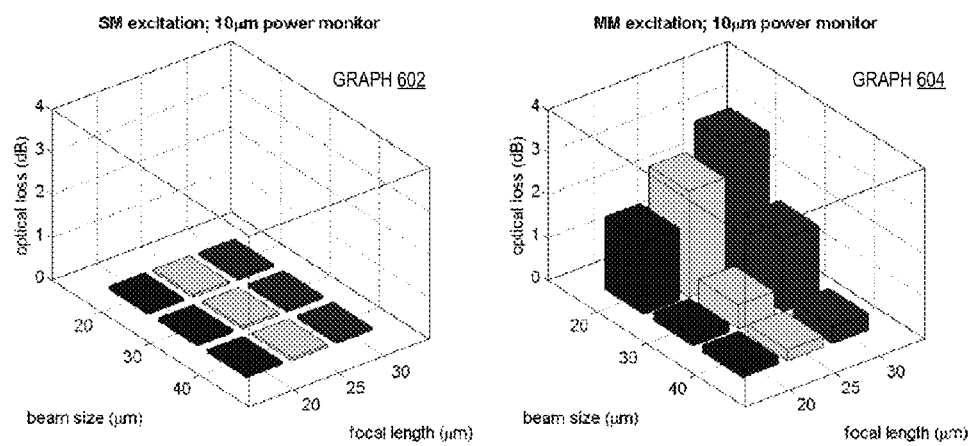
FIG. 6 is a graphical representation of an embodiment of optical loss characteristics of a circuit with a photodetector having a focusing mirror.

FIG. 6 is a graphical representation of an embodiment of optical loss characteristics of a circuit with a photodetector having a focusing mirror. Graph 602 illustrates a summarization of simulation results with different combinations of W (beam size) and f (focal length). To reduce the focused light spot size, W can be increased, or f can be decreased. Increasing W can be done easily by tapering up the input waveguide width. The ability to decrease f is limited by the size of the target PD/APD.

As seen in graph 602, with SM excitation, different sizes of W and f did not affect the optical loss. All optical loss was minimal. As seen in graph 604, with MM excitation, the greatest optical loss occurred at the smallest beam size (20 µm) in combination with the longest focal length (30 µm). With a 40 µm value of W, simulations predict an optical loss below 1 dB for 20, 25, and 30 µm values of f.

Figure 7:
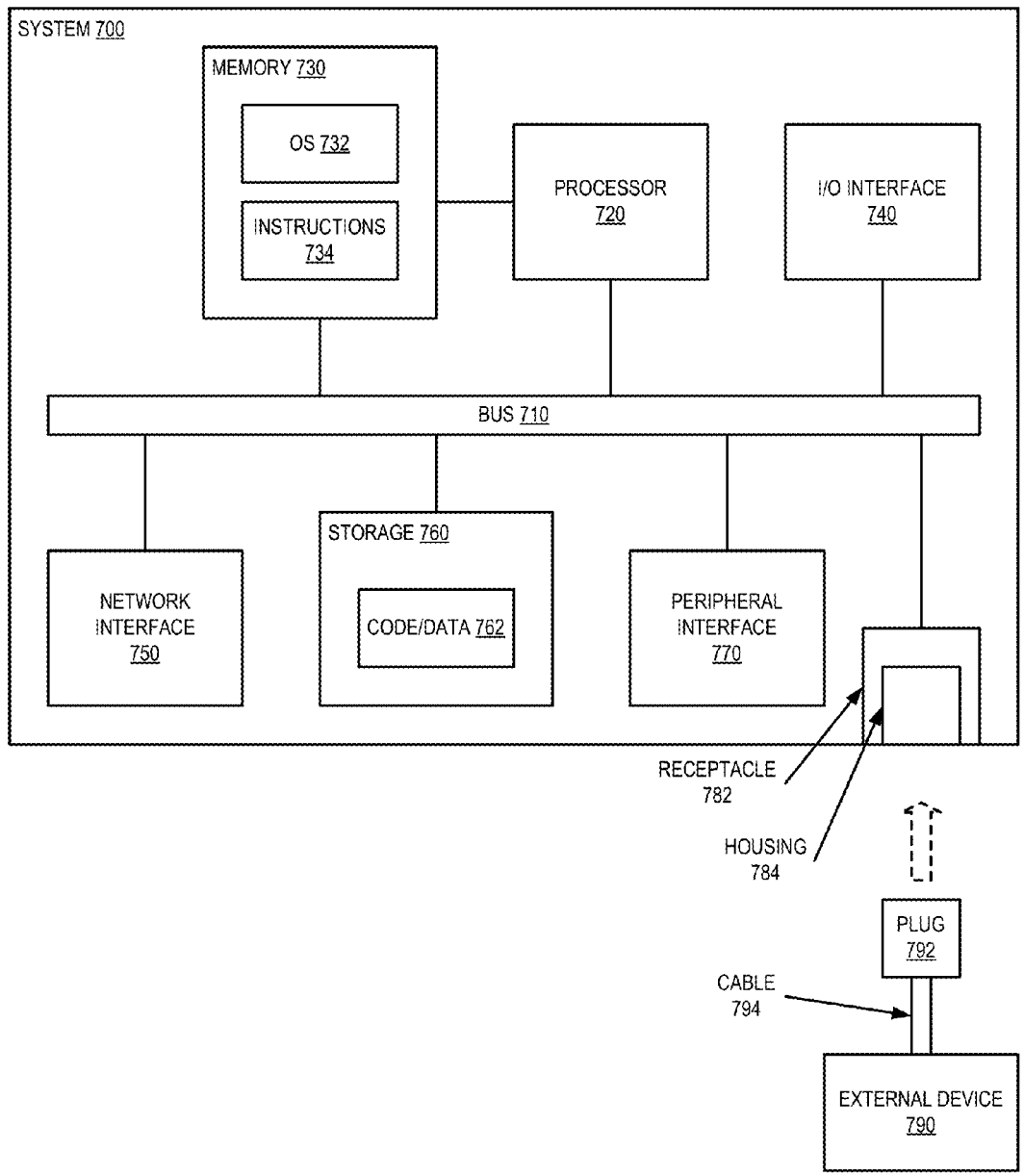
FIG. 7 is a block diagram of an embodiment of a computing system in which a register of the memory subsystem is accessed indirectly by a host processor.

FIG. 7 is a block diagram of an embodiment of a computing system in which a register of the memory subsystem is accessed indirectly by a host processor. System 700 represents a computing device in accordance with any embodiment described herein, and can be a laptop computer, a desktop computer, a server, a gaming or entertainment control system, a scanner, copier, printer, mobile computing and/or communications device, or other electronic device. System 700 includes processor 720, which provides processing, operation management, and execution of instructions for system 700. Processor 720 can include any type of microprocessor, central processing unit (CPU), processing core, or other processing hardware to provide processing for system 700. Processor 720 controls the overall operation of system 700, and can be include, one or more programmable general-purpose or special-purpose microprocessors, digital signal processors (DSPs), programmable controllers, application specific integrated circuits (ASICs), programmable logic devices (PLDs), or the like, or a combination of such devices.

Memory 730 represents the main memory of system 700, and provides temporary storage for code to be executed by processor 720, or data values to be used in executing a routine. Memory 730 can include one or more memory devices such as read-only memory (ROM), flash memory, one or more varieties of random access memory (RAM), or other memory devices, or a combination of such devices. Memory 730 stores and hosts, among other things, operating system (OS) 732 to provide a software platform for execution of instructions in system 700. Additionally, other instructions 734 are stored and executed from memory 730 to provide the logic and the processing of system 700. OS 732 and instructions 734 are executed by processor 720.

Processor 720 and memory 730 are coupled to bus/bus system 710. Bus 710 is an abstraction that represents any one or more separate physical buses, communication lines/interfaces, and/or point-to-point connections, connected by appropriate bridges, adapters, and/or controllers. Therefore, bus 710 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 710 can also correspond to interfaces in network interface 750.

System 700 also includes one or more input/output (I/O) interface(s) 740, network interface 750, one or more internal mass storage device(s) 760, and peripheral interface 770 coupled to bus 710. I/O interface 740 can include one or more interface components through which a user interacts with system 700 (e.g., video, audio, and/or alphanumeric interfacing). Network interface 750 provides system 700 the ability to communicate with remote devices (e.g., servers, other computing devices) over one or more networks. Network interface 750 can include an Ethernet adapter, wireless interconnection components, USB (universal serial bus), or other wired or wireless standards-based or proprietary interfaces.

Storage 760 can be or include any conventional medium for storing large amounts of data in a nonvolatile manner, such as one or more magnetic, solid state, or optical based disks, or a combination. Storage 760 hold code or instructions and data 762 in a persistent state (i.e., the value is retained despite interruption of power to system 700). Storage 760 can be generically considered to be a "memory," although memory 730 is the executing or operating memory to provide instructions to processor 720. Whereas storage 760 is nonvolatile, memory 730 can include volatile memory (i.e., the value or state of the data is indeterminate if power is interrupted to system 700).

Peripheral interface 770 can include any hardware interface not specifically mentioned above. Peripherals refer generally to devices that connect dependently to system 700. A dependent connection is one where system 700 provides the software and/or hardware platform on which operation executes, and with which a user interacts.

In one embodiment, system 700 can include one or more receptacles 782 with housing 784 to receive plug 792 or mate with plug 792 to connect to external device 790. Receptacle 782 includes housing 784, which provides the mechanical connection mechanisms. As used herein, mating one connector with another refers to providing a mechanical connection. The mating of one connector with another typically also provides a communication connection. Receptacle 782 can connect directly to one or more buses of bus system 710, or receptacle 782 can be associated directly with one or more devices, such as network interface 750, I/O interface 740, storage 760, or peripheral interface 770.

Plug 792 is a connector plug that allows external device 790 (which can be any of the same types of devices discussed above) to interconnect with device 700. Plug 792 can be directly built into external device 790 (with or without a cord or cable 794), or can be interconnected to external device 790 via a standalone cable. In one embodiment, plug 792 supports communication via an optical interface or both an optical interface and an electrical interface. The interconnection of receptacle 782 to bus 710 can similarly include an optical path or both an optical and electrical signal path. Receptacle 782 can also include an optical communication connection that is converted to an electrical signal prior to being placed on bus 710.

In one embodiment, communication over one or more optical paths includes the use of a photodetector with a focusing mirror as described herein. Optical communication into receptacle 782 can be received and converted to an electrical signal via the described photodetector.

Figure 8:
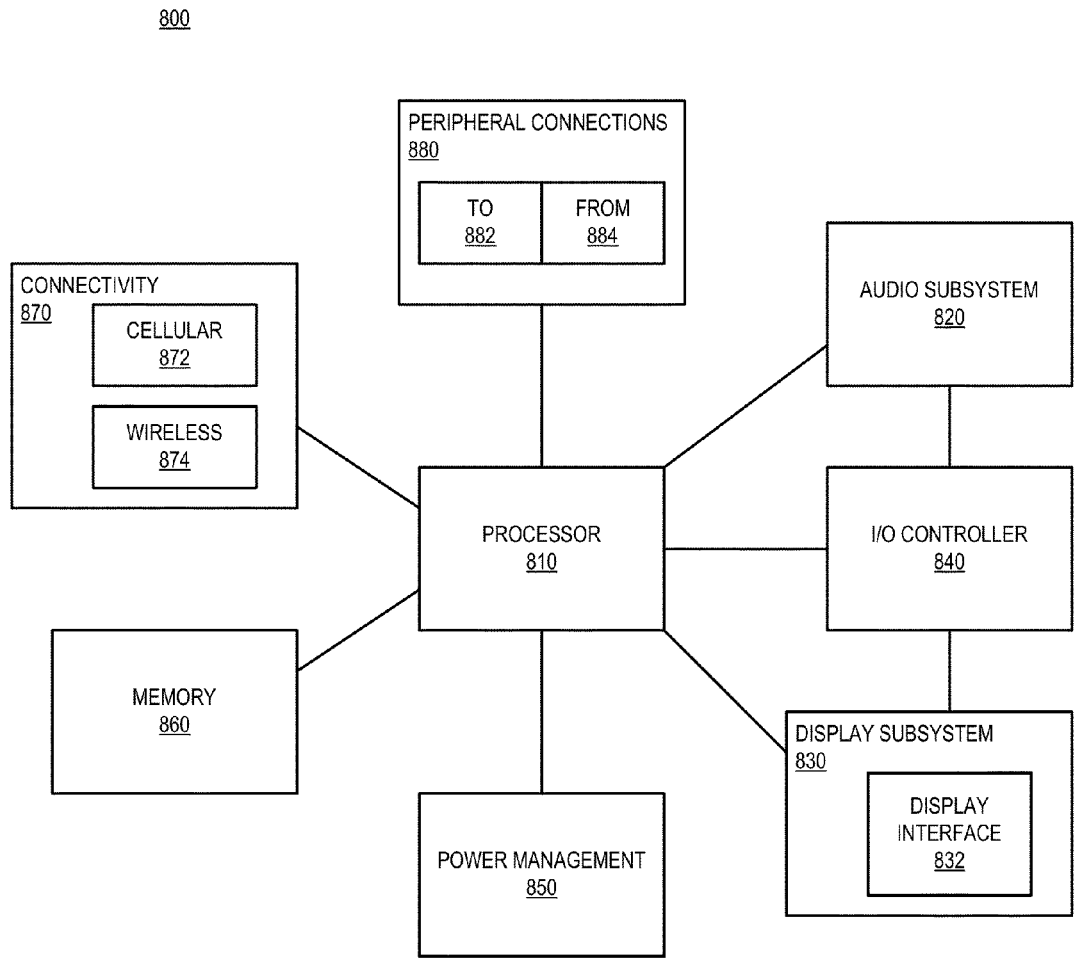
FIG. 8 is a block diagram of an embodiment of a mobile device in which a register of the memory subsystem is accessed indirectly by a host processor.

FIG. 8 is a block diagram of an embodiment of a mobile device in which a register of the memory subsystem is accessed indirectly by a host processor. Device 800 represents a mobile computing device, such as a computing tablet, a mobile phone or smartphone, a wireless-enabled e-reader, or other mobile device. It will be understood that certain of the components are shown generally, and not all components of such a device are shown in device 800.

Device 800 includes processor 810, which performs the primary processing operations of device 800. Processor 810 can include one or more physical devices, such as microprocessors, application processors, microcontrollers, programmable logic devices, or other processing means. The processing operations performed by processor 810 include the execution of an operating platform or operating system on which applications and/or device functions are executed. The processing operations include operations related to I/O (input/output) with a human user or with other devices, operations related to power management, and/or operations related to connecting device 800 to another device. The processing operations can also include operations related to audio I/O and/or display I/O.

In one embodiment, device 800 includes audio subsystem 820, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 800, or connected to device 800. In one embodiment, a user interacts with device 800 by providing audio commands that are received and processed by processor 810.

Display subsystem 830 represents hardware (e.g., display devices) and software (e.g., drivers) components that provide a visual and/or tactile display for a user to interact with the computing device. Display subsystem 830 includes display interface 832, which includes the particular screen or hardware device used to provide a display to a user. In one embodiment, display interface 832 includes logic separate from processor 810 to perform at least some processing related to the display. In one embodiment, display subsystem 830 includes a touchscreen device that provides both output and input to a user.

I/O controller 840 represents hardware devices and software components related to interaction with a user. I/O controller 840 can operate to manage hardware that is part of audio subsystem 820 and/or display subsystem 830. Additionally, I/O controller 840 illustrates a connection point for additional devices that connect to device 800 through which a user might interact with the system. For example, devices that can be attached to device 800 might include microphone devices, speaker or stereo systems, video systems or other display device, keyboard or keypad devices, or other I/O devices for use with specific applications such as card readers or other devices.

As mentioned above, I/O controller 840 can interact with audio subsystem 820 and/or display subsystem 830. For example, input through a microphone or other audio device can provide input or commands for one or more applications or functions of device 800. Additionally, audio output can be provided instead of or in addition to display output. In another example, if display subsystem includes a touchscreen, the display device also acts as an input device, which can be at least partially managed by I/O controller 840. There can also be additional buttons or switches on device 800 to provide I/O functions managed by I/O controller 840.

In one embodiment, I/O controller 840 manages devices such as accelerometers, cameras, light sensors or other environmental sensors, gyroscopes, global positioning system (GPS), or other hardware that can be included in device 800. The input can be part of direct user interaction, as well as providing environmental input to the system to influence its operations (such as filtering for noise, adjusting displays for brightness detection, applying a flash for a camera, or other features).

In one embodiment, device 800 includes power management 850 that manages battery power usage, charging of the battery, and features related to power saving operation. Memory 860 includes memory devices for storing information in device 800. Memory 860 can include nonvolatile (state does not change if power to the memory device is interrupted) and/or volatile (state is indeterminate if power to the memory device is interrupted) memory devices. Memory 860 can store application data, user data, music, photos, documents, or other data, as well as system data (whether long-term or temporary) related to the execution of the applications and functions of system 800.

Connectivity 870 includes hardware devices (e.g., wireless and/or wired connectors and communication hardware) and software components (e.g., drivers, protocol stacks) to enable device 800 to communicate with external devices. The device could be separate devices, such as other computing devices, wireless access points or base stations, as well as peripherals such as headsets, printers, or other devices.

Connectivity 870 can include multiple different types of connectivity. To generalize, device 800 is illustrated with cellular connectivity 872 and wireless connectivity 874. Cellular connectivity 872 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 874 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 880 include hardware interfaces and connectors, as well as software components (e.g., drivers, protocol stacks) to make peripheral connections. It will be understood that device 800 could both be a peripheral device ("to" 882) to other computing devices, as well as have peripheral devices ("from" 884) connected to it. Device 800 commonly has a "docking" connector to connect to other computing devices for purposes such as managing (e.g., downloading and/or uploading, changing, synchronizing) content on device 800. Additionally, a docking connector can allow device 800 to connect to certain peripherals that allow device 800 to control content output, for example, to audiovisual or other systems.

In addition to a proprietary docking connector or other proprietary connection hardware, device 800 can make peripheral connections 880 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one embodiment, peripheral connections 880 include one or more optical interconnects. The optical interconnections can provide communication over one or more optical paths includes the use of a photodetector with a focusing mirror as described herein. Optical communication can be received and converted to an electrical signal via a photodetector in accordance with any embodiment described herein.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A semiconductor photonic integrated circuit (I/C), comprising:
a waveguide integrated within a semiconductor substrate layer of the I/C, the waveguide horizontally constrained by parallel oxide structures on either side of a semiconductor material of the semiconductor substrate layer, the waveguide having a waveguide width defined by the parallel oxide structures, where an optical signal is to propagate horizontally along the waveguide;

a photodetector structure integrated within the semiconductor substrate layer of the I/C, and not within the waveguide defined by the parallel oxide structures;

a focusing mirror to focus light of the optical signal to a redirected width smaller than the waveguide width and redirect the light of the optical signal to propagate horizontally along a plane parallel to a surface of the semiconductor substrate layer to exchange the light of the optical signal between the waveguide and the photodetector structure; and multiple photodetector electrical contacts to operate the photodetector structure, the multiple photodetector electrical contacts including a first photodetector electrical contact and a second photodetector electrical contact arranged on opposite sides of the photodetector structure along a line extending athwart a length of the photodetector structure, wherein light redirected by the focusing mirror propagates along the length of the photodetector structure, and wherein a distance between the first photodetector electrical contact and the second photodetector electrical contact is greater than the waveguide width.

2. The semiconductor photonic I/C of claim 1, wherein the focusing mirror comprises a sidewall with multiple flat facets that cause the optical signal to redirect with total internal reflection.

3. The semiconductor photonic I/C of claim 1, wherein the focusing mirror comprises a parabolic mirror that causes the optical signal to redirect with total internal reflection.

4. The semiconductor photonic I/C of claim 1, wherein the optical signal comprises a single-mode optical signal.

5. The semiconductor photonic I/C of claim 1, wherein the optical signal comprises a multi-mode optical signal.

6. The semiconductor photonic I/C of claim 1, wherein the focusing mirror comprises a material having a different refractive index from the semiconductor material of the waveguide to cause total internal reflection of the optical signal.

7. The semiconductor photonic I/C of claim 1, wherein the focusing mirror comprises a layer of metal manufactured into the semiconductor substrate layer.

8. The semiconductor photonic I/C of claim 1, wherein the waveguide and the focusing mirror are in a common plane of the I/C, and wherein the photodetector structure is in a plane vertically above the common plane of the waveguide and the focusing mirror, and further comprising a re-entrant mirror disposed in the common plane of the waveguide and the focusing mirror to redirect the light of the optical signal to exchange the light of the optical signal between the focusing mirror and the photodetector structure.

9. The semiconductor photonic I/C of claim 8, wherein the re-entrant mirror comprises an angled surface having an air gap, wherein the angled surface has an angle to cause total internal reflection of the optical signal and redirect the optical signal to the photodetector structure.

10. The semiconductor photonic I/C of claim 1, wherein the length of the photodetector structure is than a width of the photodetector structure, and wherein the multiple photodetector electrical contacts include at least one photodetector electrical contact disposed vertically above and horizontally over the photodetector structure.

11. The semiconductor photonic I/C of claim 1, wherein the focusing mirror is to horizontally redirect the light to a focal point that is in a line approximately 90 degrees different from a direction of propagation of the optical signal along the waveguide.

12. The semiconductor photonic I/C of claim 1, wherein the focusing mirror is to horizontally redirect the light to a focal point that is in a line less than 90 degrees different from a direction of propagation of the optical signal along the waveguide.

13. The semiconductor photonic I/C of claim 1, wherein the focusing mirror is to horizontally redirect the light to a focal point that is in a line more than 90 degrees different from a direction of propagation of the optical signal along the waveguide.

14. A semiconductor photonic integrated circuit (I/C), comprising:

a waveguide integrated within a semiconductor substrate layer of the I/C, the waveguide horizontally constrained by parallel oxide structures on either side of a semiconductor material of the semiconductor substrate layer, the waveguide having a waveguide width defined by the parallel oxide structures, where an optical signal is to propagate horizontally along the waveguide;

a photodetector structure integrated within the semiconductor substrate layer of the I/C, the photodetector structure being in a plane vertically above the waveguide, and the photodetector structure being at a right angle from a direction of propagation of the optical signal along the waveguide;

a re-entrant mirror disposed in a common plane with the waveguide to redirect the light vertically between the plane of the photodetector structure and the common plane;

a focusing mirror to focus light of the optical signal to a focused width smaller than the waveguide width and redirect the light of the optical signal to propagate horizontally along a plane of the semiconductor substrate layer at a right angle to exchange the light of the optical signal between the photodetector structure and the waveguide; and multiple photodetector electrical contacts to operate the photodetector structure, the multiple photodetector electrical contacts including a first photodetector electrical contact and a second photodetector electrical contact arranged on opposite sides of the photodetector structure along a line extending athwart a length of the photodetector structure, wherein light redirected by the focusing mirror propagates along the length of the photodetector structure, and wherein a distance between the first photodetector electrical contact and the second photodetector electrical contact is greater than the waveguide width.

15. The semiconductor photonic I/C of claim 14, wherein the focusing mirror comprises a surface with multiple flat facets that cause the optical signal to redirect with total internal reflection or a parabolic mirror that causes the optical signal to redirect with total internal reflection.

16. The semiconductor photonic I/C of claim 14, wherein the optical signal comprises a single-mode optical signal or multimode optical signal.

17. The semiconductor photonic I/C of claim 14, wherein the focusing mirror comprises a material having a different refractive index from the semiconductor material of the waveguide to cause total internal reflection of the optical signal.

18. The semiconductor photonic I/C of claim 14, wherein the focusing mirror comprises a layer of metal manufactured into the semiconductor.

19. The semiconductor photonic I/C of claim 14, wherein the re-entrant mirror comprises an angled surface having an air gap, wherein the angled surface has an angle to cause total internal reflection of the optical signal and redirect the optical signal to the photodetector structure.

20. The semiconductor photonic I/C of claim 14, wherein the length of the photodetector structure is greater than a width of the photodetector structure, and wherein the multiple photodetector electrical contacts include at least one photodetector electrical contact disposed vertically above and horizontally over the photodetector structure.

21. The semiconductor photonic I/C of claim 14, wherein the focusing mirror is to horizontally redirect the light to a focal point that is in a line less than or equal to 90 degrees different from a direction of propagation of the optical signal along the waveguide.

22. An integrated circuit (I/C), comprising:
- a waveguide integrated within a semiconductor substrate layer of the I/C, the waveguide horizontally constrained by parallel oxide structures on either side of a semiconductor material of the semiconductor substrate layer, the waveguide having a waveguide width defined by the parallel oxide structures, where an optical communication signal is to propagate horizontally along the waveguide;
- a photodetector structure integrated within the semiconductor substrate layer of the I/C, the photodetector structure being in a plane vertically above the waveguide, and the photodetector structure being at a right angle from a direction of propagation of the optical signal along the waveguide;
- a re-entrant mirror disposed in a common plane with the waveguide to redirect the light vertically between the plane of the photodetector structure and the common plane;
- a focusing mirror to focus light of the optical signal to a focused width smaller than the waveguide width and redirect the light of the optical signal to propagate horizontally along a plane of the semiconductor substrate layer at a right angle to exchange the light of the optical signal between the photodetector structure and the waveguide;
- multiple photodetector electrical contacts to operate the photodetector structure, the multiple photodetector electrical contacts including a first photodetector electrical contact and a second photodetector electrical contact arranged on a surface of the I/C, and on opposite sides of the photodetector structure, along a line extending athwart a length of the photodetector structure, wherein light redirected by the focusing mirror propagates along the length of the photodetector structure, and wherein a distance between the first photodetector electrical contact and the second photodetector electrical contact is greater than the wave guide width; and
- an optical communication processor coupled to the electrical contacts to receive and decode the optical communication signal.

23. The I/C of claim 22, wherein the focusing mirror comprises a surface with multiple flat facets that cause the optical signal to redirect with total internal reflection or a parabolic mirror that causes the optical signal to redirect with total internal reflection.

24. The I/C of claim 22, wherein the focusing mirror comprises a layer of metal manufactured into the semiconductor substrate layer.

25. The I/C of claim 22, wherein the length of the photodetector structure being greater than a width of the photodetector structure, and wherein the multiple photodetector electrical contacts include at least one photodetector electrical contact disposed vertically above and horizontally over the photodetector structure.

* * * * *